(12) United States Patent
Kattan

(10) Patent No.: US 6,931,338 B2
(45) Date of Patent: Aug. 16, 2005

(54) SYSTEM FOR PROVIDING A CALIBRATED PATH FOR MULTI-SIGNAL CABLES IN TESTING OF INTEGRATED CIRCUITS

(75) Inventor: Shalom Kattan, Campbell, CA (US)

(73) Assignee: Guide Technology, Inc., Sunnyvale, CA (US)

(*) Notice: Subject to any disclaimer, the term of this patent is extended or adjusted under 35 U.S.C. 154(b) by 103 days.

(21) Appl. No.: 10/337,943

(22) Filed: Jan. 7, 2003

(65) Prior Publication Data

US 2004/0133374 A1 Jul. 8, 2004

(51) Int. Cl.$^7$ .......................... G01R 31/28; G01R 35/04
(52) U.S. Cl. ...................... 702/89; 368/113; 368/121; 702/85; 702/117
(58) Field of Search ............................ 702/79, 89, 117, 702/125, 176, 187; 324/359; 73/1.42; 368/113, 184, 121; 375/354, 355; 370/519

(56) References Cited

U.S. PATENT DOCUMENTS

| | | | |
|---|---|---|---|
| 4,827,437 A | * | 5/1989 | Blanton ........................ 702/89 |
| 5,402,073 A | | 3/1995 | Ross |
| 6,032,107 A | | 2/2000 | Hitchcock |
| 6,091,671 A | | 7/2000 | Kattan |
| 6,181,649 B1 | | 1/2001 | Kattan |
| 6,185,509 B1 | | 2/2001 | Wilstrup et al. |
| 6,194,925 B1 | | 2/2001 | Kimsal et al. |
| 6,226,231 B1 | | 5/2001 | Kattan |
| 6,298,315 B1 | | 10/2001 | Li et al. |
| 6,356,850 B1 | | 3/2002 | Wilstrup et al. |
| 6,393,088 B1 | | 5/2002 | Emineth et al. |
| 6,449,570 B1 | | 9/2002 | Wilstrup et al. |
| 6,609,077 B1 | * | 8/2003 | Brown et al. ................ 702/117 |
| 2001/0028262 A1 | | 10/2001 | Kimsal et al. |
| 2001/0044704 A1 | | 11/2001 | Li et al. |
| 2002/0120420 A1 | | 8/2002 | Wilstrup et al. |

* cited by examiner

*Primary Examiner*—John Barlow
*Assistant Examiner*—John Le
(74) *Attorney, Agent, or Firm*—Dority & Manning, P.A.

(57) ABSTRACT

A system for calibrating cables attached to a time measurement device is disclosed. The system includes a calibration device that generates a plurality of synchronized measurement signals that are communicated to a time measurement device by a set of cables. The calibration device can also generate at least one arming signal that is also communicated to the time measurement device. By determining the relative arrival time of a common reference event of each of the measurement signals, the time measurement device can determine any skew that exists between each of the cables that input the measurement signals. The skew can then be used to compensate for varying cable skew in future time measurements. In one embodiment, the system of the present invention can also be used to determine the arming latency of the time measurement device by delaying the measurement signals in relation to the arming signals and observing the delay time which causes complete synchronization of the measurement signals.

19 Claims, 8 Drawing Sheets

SYSTEM FOR PROVIDING A CALIBRATED PATH FOR MULTI-SIGNAL CABLES IN TESTING OF INTEGRATED CIRCUITS

BACKGROUND OF THE INVENTION

Meeting timing requirements is a critical portion of the design and operation of systems in a wide variety of technological fields. Computer chipmakers continually reduce the minimum size of devices while simultaneously increasing speed and complexity to improve performance. Each reduction in size and increase in speed demands a higher level of precision in the timing of the electrical pulses input and output by the chip.

A number of methods and devices have been developed for high-speed and high-precision timing testing. The devices, generally referred to as "Automated Testing Equipment," come in a wide variety of forms.

Automated Test Equipment includes devices, frequently referred to as "Time Measurement Units," for measuring time intervals and signal events. An example of a time measurement unit is found in U.S. Pat. No. 6,091,671, issued to Kattan, for a time interval analyzer, which is incorporated herein by reference.

A number of time measurement units are commercially available to measure time events and interpret data gathered from such measurements. These time measurement units are typically used in conjunction with some sort of measurement interface between the point of measurement (for example, an electronic circuit board connection) and the time measurement unit. The measurement interface, referred to as an Automated Testing Equipment (ATE) loadboard, is commonly connected to the time measurement unit via (typically coaxial) cables.

The cables, while providing a signal path from the testing equipment to the time measurement unit, are not ideal components. As the frequency of a signal increases, physical factors such as a cable's length and frequency response become substantially more important.

At extremely high frequencies, even the slightest deviations in the cables—deviations such as bends, kinks, or length variations—can have an adverse effect on the accuracy of time measurements. When the length of a signal pulse is many orders of magnitude smaller than the length of the cable it is sent through, a simple bend in the cable could delay the signal enough to render a time measurement useless. Since it is nearly impossible and not economical to eliminate all the causes of such problems, there must be compensation for the signal irregularities that the cables introduce.

In the prior art there can be found several attempts to address the problem of cable-induced signal irregularities through calibration of test equipment. One such example can be found in U.S. Pat. No. 6,032,107 issued to Hitchcock, entitled "Calibrating Test Equipment." The calibration methods and apparatus taught in the Hitchcock patent rely upon usage of a test article measured with calibrated test equipment. The test article is measured using the uncalibrated equipment, and the resulting measurements are compared to those taken by the calibrated equipment. One of the deficiencies of this method, however, is that it does not address the situation where there is no previously calibrated equipment.

Additionally, the complex nature of many time measurement units can be the source of timing errors as well. Typically, a time measurement unit must be "armed," or prepared, to take a measurement. The arming circuitry of the time measurement unit causes a delayed response to the arming signal. This arming latency can vary with temperature and other factors, and introduces another variable that must be taken into account in time measurement. Without knowledge of the arming latency, it can be very difficult to make accurate measurements because the exact time that the measurement is taken is indeterminate.

SUMMARY OF THE INVENTION

The present invention is generally directed to a system for calibrating a time measurement device to compensate for irregularities in interface connections to time measurement equipment. The irregularities can be introduced by various factors, particularly by variations in cables that carry signals to the time measurement device.

For example, when calibrating a time measurement device to compensate for cables that carry signals to the device, the process of the present invention can include the steps of generating a plurality of synchronized signals. The measurement signals can be communicated to the time measurement device by the corresponding set of cables that undergo calibration upon a software command.

The time measurement device is used to determine the relative arrival time to a common reference event of each of the measurement signals. Any skew that exists between each of the cables can then be determined by comparing the time differences between the relative arrival times of the common reference event to each of the transmitted synchronized signals.

Once a specific cable skew has been determined, this data can be stored by the time measurement device for making adjustments in future time measurements.

The synchronized measurements that can be generated and communicated to the time measurement device can be single ended signals or can be a pair of complementary differential signals. When the measurement signals are differential signals, the common reference event can be where the differential signals cross each other at one of the channels that is designated as a reference channel.

In some applications, an additional compensation scheme may also be needed in order to calibrate the arming circuitry of a time measurement device. This compensation is needed to ensure that the test equipment is aware of any delay that exists between an arming circuit and a signal channel. This delay is often referred to as arming latency and needs to be known.

If desired, the disclosed calibration system can also be used to determine the arming latency of a time measurement device including the cables that connect each arming signal from the loadboard to the time measurement device. As will be described in more detail below, the arming latency can be determined by generating multiple arming signal pulses and measurement pulses having an increasing delay between them that are communicated to the time measurement device. From the times of occurrence of the received measurement pulses and the times of occurrence of the arming signal pulses, the time measurement device can then determine the time interval between the time of receipt of the arming signal and a measured measurement pulse, thus determining the arming latency.

The system of the present invention for calibrating irregularities in time measurement devices can include a time measurement device in communication with a calibration device. The calibration device can include at least one signal generator for generating a plurality of synchronized measurement signals. In addition, the calibration device may contain at least one signal that can be used as an arming signal. A transmission element can be provided for forming a signal path from the calibration device to the time measurement device.

In one embodiment, the calibration device can include at least one output buffer-expander that is connected to the signal generator. The output buffer-expander can reproduce and convert the measurement and arming signal pattern input into a plurality of synchronized measurement and synchronized arming signal pattern outputs for communication to the time measurement device. The calibration device can also include adjustable delay circuitry interposed between the signal generator and the output buffer-expander which delays the transmission of one of the signal generator pattern outputs.

The calibration device can further include a nonvolatile and programmable solid-state memory storage that is readable by the signal generator to store particular data needed to ensure complete synchronization of the output signals.

Other features and aspects of the present invention will be discussed in greater detail below.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
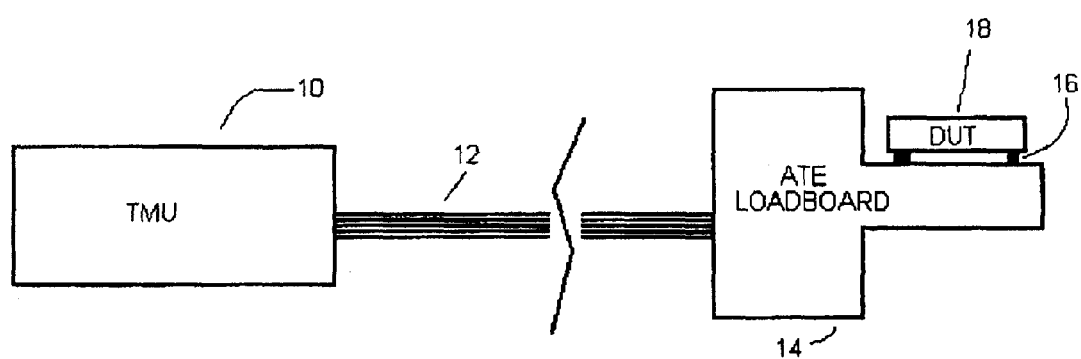
FIG. 1 is a side view depicting the connection between a time measurement unit via cables to an automated testing equipment loadboard and a device under test.

Repeat use of reference characters throughout the present specification and appended drawings is intended to represent the same or analogous features or elements of the invention.

DETAILED DESCRIPTION OF THE PREFERRED EMBODIMENTS

Reference will now be made in detail to presently preferred embodiments of the invention, examples of which are fully represented in the accompanying drawings. Such examples are provided by way of an explanation of the invention, not limitation thereof. In fact, it will be apparent to those skilled in the art that various modifications and variations can be made in the present invention, without departing from the spirit and scope thereof. For instance, features illustrated or described as part of one embodiment can be used on another embodiment to yield a still further embodiment. Still further variations in selection of materials and/or characteristics may be practiced, to satisfy particular desired user criteria. Thus, it is intended that the present invention covers such modifications and variations as come within the scope of the present features and their equivalents.

Figure 2:
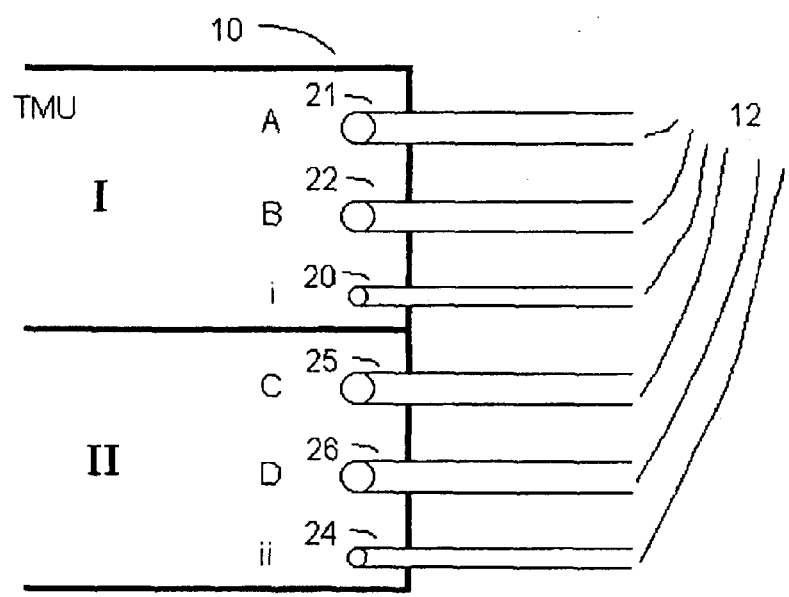
FIG. 2 is an exploded view of the signal input connections of the time measurement unit illustrated in FIG. 1.

FIG. 1 illustrates a conventional configuration for the testing of a device using a time measurement unit (TMU) 10 and automated testing equipment (ATE) loadboard 14. As depicted in greater detail in FIG. 2, time measurement unit 10 features arming channels 20 and 24 and measurement channels 21, 22, 25, and 26 for receiving signal inputs from a device under test (DUT). Four measurement channels and two arming channels are provided for illustration purposes; those skilled in the art will appreciate that the methods and apparatus disclosed herein could easily accommodate fewer or more measurement and arming channels.

During testing of the device under test (DUT), the arming and measurement signals are provided by DUT 18 to time measurement unit 10 through automated testing equipment loadboard 14. Automated testing equipment loadboard 14 serves as an interface, taking signals received from DUT 18 through a socket 16 and routing them to time measurement unit 10 via connecting cables 12. DUT 18 can be any number of a wide variety of devices for which precise timing measurements may be required, including, but not limited to, electronic circuits and chips.

Figure 3:
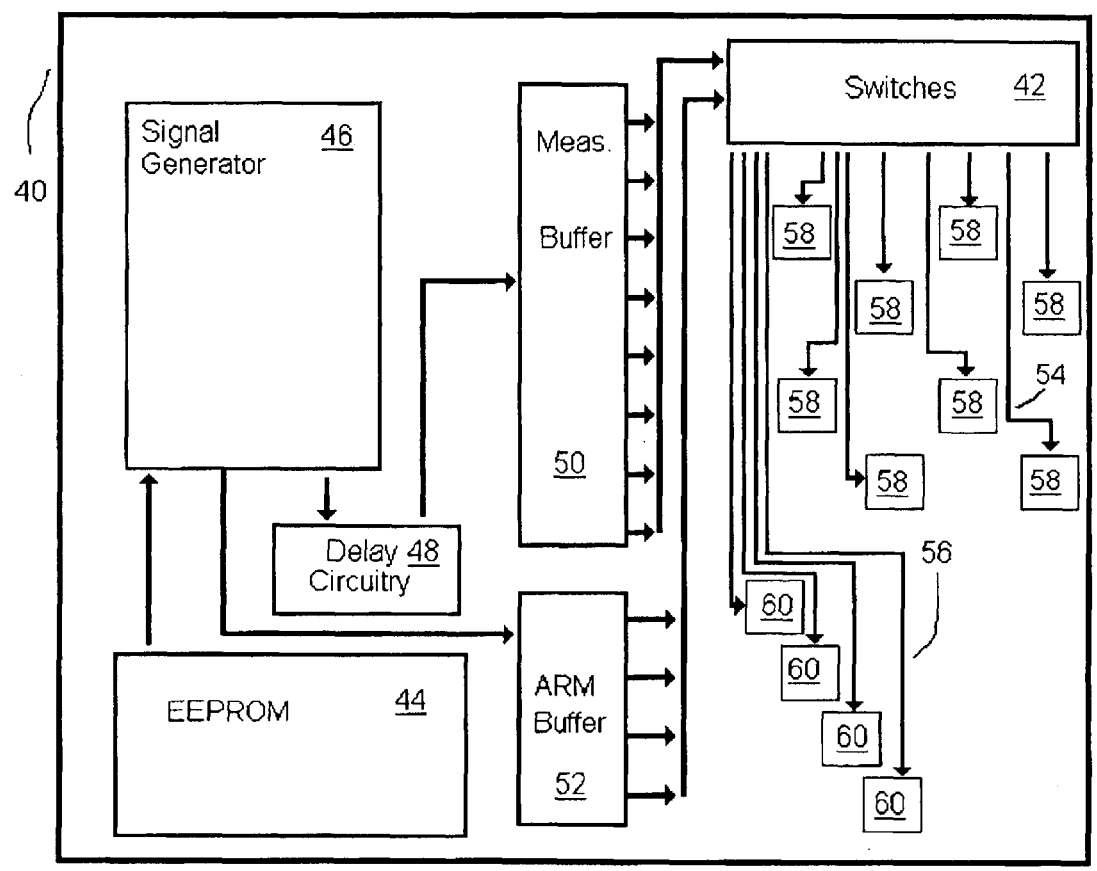
FIG. 3 is a block diagram illustration of a calibration device in accordance with one embodiment of this invention.

For calibrating time measurement unit 10 in order to compensate for errors introduced by the connecting cables 12, calibration board 40 as illustrated generally in FIG. 3 is connected to the Automated Testing Equipment loadboard 14. The calibration board includes a signal source generator 46, preferably generating fast and stable edges, measurement signal buffer-expander 50, adjustable signal delay circuitry 48, arming signal buffer-expander 52, matched measurement signal traces 54, matched arming traces 56, matched routing cables 62 and 64 (shown in FIGS. 4(a) and 4(b)), a memory storage device (in the embodiments illustrated, an EEPROM) 44, and configuration switch bank 42. While further description of the invention refers to EEPROM 44, any suitable reprogrammable nonvolatile memory can be utilized in the aspects and embodiments of the present invention. In one embodiment, configuration switch bank may include switches and inverter circuitry. Thus, the routing of signal outputs can be selected, as well as the type of signal (such as single ended, differential, or a combination of the two types).

When used to calibrate the time measurement unit 10, calibration board 40 is interfaced with automated testing equipment loadboard 14 in place of a DUT, and routing cables 62 and 64 are connected from the measurement and arming signal outputs to the automated testing equipment loadboard signal connections 66 and 68. Those skilled in the art will appreciate the, fact that the exact connection and routing of cables 62 and 64 to automated testing equipment loadboard 14 will vary depending upon the configuration of time measurement unit 10 and the particular calibration test that is desired, as discussed in detail further in this application.

Upon execution of the calibration routine, signal source generator 46 accesses the EEPROM memory. This memory contains a specialized sequence of bit outputs that correspond to certain information relating to the specific calibration device 40. Such information may include pulse frequency and interval information, nominal voltage levels, and test program identification/initialization data, as well as any data regarding residual skew on the synchronized signals generated by calibration device 40.

Because the calibration board 40 outputs digital signals, data containing information to prepare time measurement unit 10 to perform the calibration sequence can be included in the output sequence. The data bits are followed by the actual test bits required for the calibration tests to be performed.

In one embodiment, the calibration sequence is repeated so that time measurement unit 10 can sample the entire sequence of bits and determine which parts contain calibration data. After reading and processing the calibration setup data, time measurement unit 10 can select the appropriate point in the bit sequence to begin calibration measurements. This selection process may be enabled by providing a special series of bits in the bit sequence recognizable by time measurement unit 10.

This calibration data provided by the calibration board preferably contains information relating to any slight on-board deviations in signal trace lengths. As discussed later in this application, precise synchronization of signals at the calibration board is required for many calibration procedures. The use of previously measured or calculated deficiencies in the calibration board can add another level of precision to the calibration of time measurement unit 10.

The signal output by signal generator 46 is routed to measurement signal output buffer-expander 50, which converts the signal pattern from signal generator 46 into a plurality of identical differential measurement channel signals. These measurement channel signals are routed to the plurality of output connections 58 through matched signal traces 54. The particular routing of the signals is dependent upon the configuration of switch bank 42 that is set by the user to correspond to the desired calibration procedure. For example, for single-ended skew calibration tests, only one of each complementary pair will be routed to the measurement channels. In additional embodiments, switch bank 42 may include inverter circuitry such that differential output components could be generated based upon a single-ended signal generated by the source generator, if desired.

The measurement channel signals are then routed through matched measurement channel signal routing cables 62 to the appropriate connection of automated testing equipment loadboard 14 using connectors 66 and 68. The signal traces 54 and routing cables 62 are precisely electrically matched in order to reproduce the signals as accurately as possible. In most applications, any deviation between the synchronized signals at any of the outputs should be no greater than about 20 picoseconds.

The signal output of the generator 46 is also routed to arming buffer-expander circuitry 52. The arming buffer-expander circuit 52 produces a plurality of single-ended arming signals. As in the case of the measurement channel signals, in order to ensure that the arming signals are as nearly identical as is possible, the calibration board provides precisely matched traces 56 and routing cables 64 for routing to the appropriate outputs for subsequent transmission to the time measurement unit.

Single-Ended Cable Skew Calibration

Figure 4A:
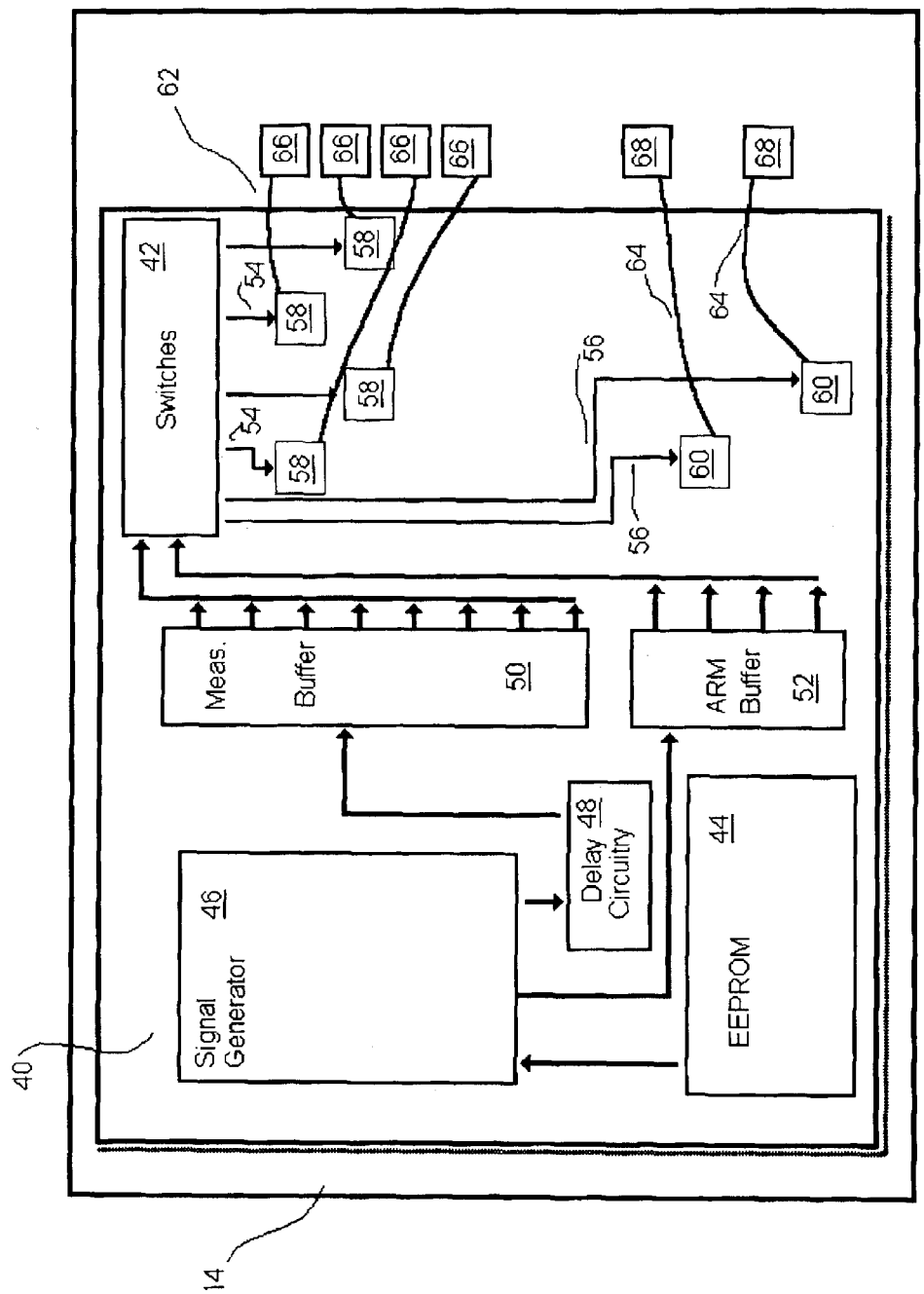
FIGS. 4(a) and 4(b) are block diagram illustrations of two embodiments of a calibration device as connected to automated testing equipment in accordance with preferred embodiments of this invention.

FIG. 4(a) illustrates an embodiment of calibration board 40 that can be used to calibrate time measurement unit 10 to account for relative skew between cables. In this particular embodiment, four measurement signal outputs 58 are connected via matched routing cables 62 to dedicated connectors 66 on automated testing equipment loadboard 40. The connectors 66 are connected to cables 12 from loadboard 14 to time measurement device 10. Four associated arming signal outputs 60 are connected via matched routing cables 64 to arming outputs 68. The arming signal outputs are similarly routed and connected to the appropriate arming inputs of time measurement device 10.

As part of a cable skew calibration algorithm or program, time measurement unit 10 is configured to recognize a reference event or events on all of the measurement channels, and to register the occurrence of such with a time stamp. A reference event preferably comprises a particular transition occurring in each of the multiple copies of the signal generated and provided to the time measurement unit 10. In one embodiment, the cable skew program is executed by a control computer system operatively associated with time measurement unit 10.

For the particular example described hereinbelow, the reference event is the first falling edge detected relative to the beginning of the signal pulse pattern. Other embodiments of the present invention may utilize other reference events. Additionally, time measurements provided in this and other examples are in no way intended to limit the precision or accuracy of this invention; the principles of operation described are applicable to any range of time scales.

Upon execution, the measurement signals simultaneously arrive at the appropriate outputs 66 that correspond and are connected to the measurement channels of time measurement unit 10. The arming signals also arrive simultaneously at the particular outputs 68 connected to the arming channels of time measurement unit 10.

In one embodiment, the arrival of the measurement signals as a group at the particular outputs 66 can be delayed (relative to the group of arming signals) by adjustable signal delay circuitry 48. This is in order to facilitate the determination of the arming latency.

Figure 5:
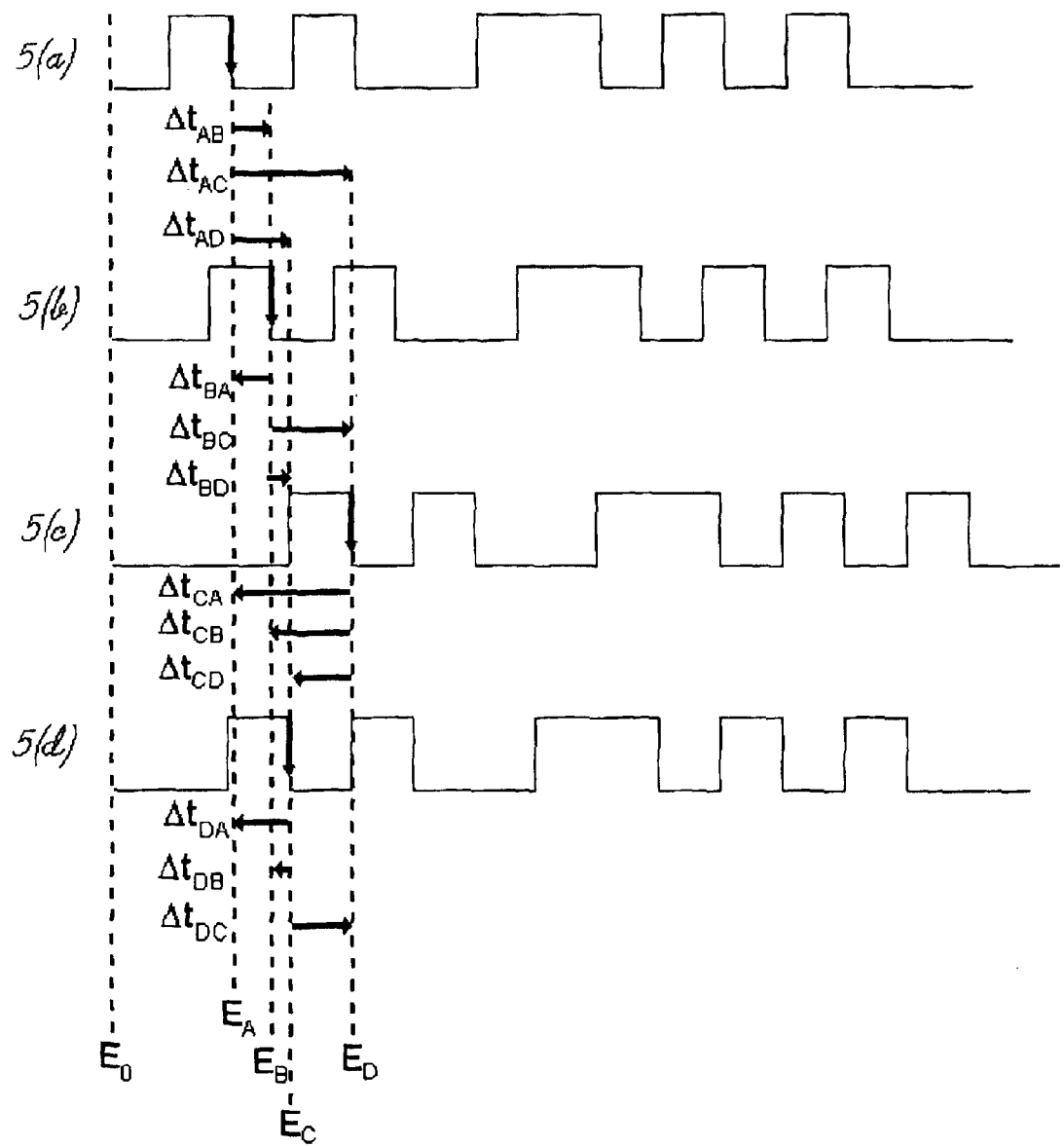
FIG. 5 provides respective timing diagrams 5(a), 5(b), 5(c), and 5(d) illustrating four measurement channels, measured reference events (a transition from high to low), and calculated skew intervals between the reference events.

Upon arrival at time measurement unit 10, the signals may have experienced cable-to-cable skew. For instance, as illustrated in FIG. 5, skew has occurred and the four measurement channel signals have not arrived at time measurement unit 10 simultaneously. Time measurement unit 10 produces an internal table of reference event time stamps taken at edges $E_A$, $E_B$, $E_C$, and $E_D$ (shown in FIG. 5) for the various channels such as the one illustrated below:

TABLE 1

| Reference Event Time Stamps | |
|---|---|
| Channel | Reference Event Time Stamp |
| A | 233.994 ns |
| B | 236.281 ns |
| C | 242.018 ns |
| D | 236.435 ns |

Time measurement unit 10 selects one channel as the "base" channel. The time stamps for the reference events on the various channels are compared to the base channel reference event time stamp to determine Δt values, which are also shown in FIG. 5. Δt represents the time difference between common reference events on different channels; for example, $\Delta t_{AB}$ represents the time difference between when a reference event was measured on channel B as compared to base channel A. To determine $\Delta t_{AB}$, time measurement unit 10 subtracts the base channel time stamp A from the comparison channel time stamp B.

$$\Delta t_{AB} = 236.281 - 233.994 = 2.287 \quad (700)$$

Equation 700 represents calculation of $\Delta t_{AB}$ using a single reference event time stamp. Other embodiments of the present invention may utilize multiple reference events on the various measurement channels. Additionally alternative embodiments may include computation of the average skew from multiple skew measurements.

The skews of the remaining channels relative to base channel A are determined similarly as illustrated below in Equations 701 and 702.

$$\Delta t_{AC} = 242.018 - 233.994 = 8.024 \quad (701)$$

$$\Delta t_{AD} = 236.435 - 236.281 = 0.154 \quad (702)$$

The process is then repeated to determine Δt values with a different reference event such as a rising edge, which could have slightly different skew levels. At the completion of the process, a Δt calibration table such as the one illustrated below can be produced.

TABLE 2

Cable Skew Calibration Table

|  | Channel: | | | |
| --- | --- | --- | --- | --- |
|  | A | B | C | D |
| relative to base A− edge | 0 | 2.287 | 8.024 | 0.154 |
| relative to base A+ edge | 0 | 2.297 | 8.028 | 2.453 |

This table contains cable skew values for each channel relative to the base for rising (+) and falling (−) edge transitions. It is stored in the time measurement unit and used to adjust future time measurements, thus substantially ridding the future time measurements of inaccuracies due to skew between cables.

Adjusting Measurements for Cable Skew

In the following example, which is provided for purposes of illustration, the system of the present invention is used for testing precision electronic equipment by checking for synchronous rising edges on two channels. Three output pulses are measured using time measurement unit channels A and C, with a desired variance of no larger than ±0.003 between the two outputs. The detection results are as follows:

TABLE 3

Example Two-Channel Unadjusted Measurements

| Rising edge | Channel A | Channel C | Deviation |
| --- | --- | --- | --- |
| #1 | 18.984 | 27.011 | 8.027 |
| #2 | 20.635 | 28.656 | 8.021 |
| #3 | 22.286 | 30.312 | 8.025 |

These results would indicate that the electronic equipment under test is defective. Recall, however, that significant skew exists between channels A and C, with $\Delta t_{AC}$ calculated in Eq. 703 to be 8.024. Accordingly, time measurement unit 10 accesses the table of cable skew values and adjusts the measurements by subtracting $\Delta t_{AC}$ from the channel C time stamps, resulting in the following corrected measurements.

TABLE 4

Example Two-Channel Measurements Adjusted for Skew

| Rising edge | Channel A | Channel C | Deviation |
| --- | --- | --- | --- |
| #1 | 18.984 | 18.987 | −0.003 |
| #2 | 20.635 | 20.632 | 0.003 |
| #3 | 22.286 | 22.288 | −0.002 |

The results, now corrected for cable skew, reflect measurements that give a more accurate indication of the performance of a device under test.

Since the time measurements obtained are relative to one another, there are many possible variations on the method for adjusting for cable-to-cable skew. For example, in an alternative embodiment, the $\Delta t_{CA}$ value could have been automatically subtracted from channel C to obtain the same result.

Differential Skew

Differential skew can be divided into two categories, namely inter-channel skew, which occurs between two differential channels, and intra-channel skew, between the two components of a differential pair. Inter-channel skew can be measured and compensated for in a very similar fashion to channel-to-channel skew for single-ended channels. In one embodiment, the only notable difference is that the reference event is when the two differential line voltages cross one another, rather than a particular edge. Intra-channel differential skew is a notable variety of cable-to-cable skew. Specifically, intra-channel differential skew is cable-to-cable skew between two lines of a differential pair.

Figure 6:
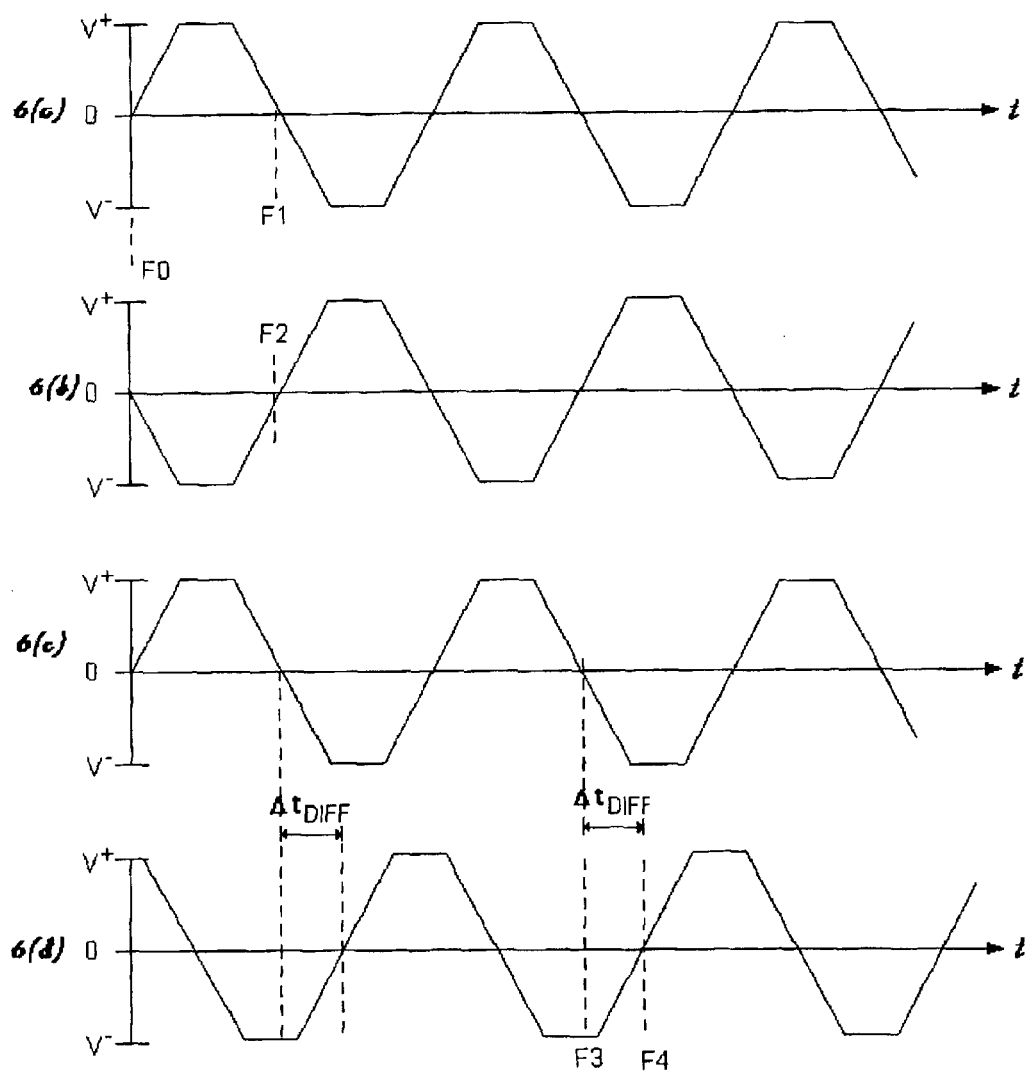
FIG. 6 displays timing diagrams 6(a)–6(d), respectively, where 6(a) and 6(b) illustrate the two components of a differential signal which has zero intra-channel skew. 6(c) and 6(d) are timing diagrams of the two components of a differential signal with a finite intra-channel skew detectable by this invention, with measured reference events and differential skew values illustrated.

In differential signaling, two cables transmitting complementary waveforms are used. The difference between the two waveforms is taken to determine the data transmitted. A typical complementary signal pair is illustrated at FIGS. 6(a) and 6(b). A logical "1" on differential line 6(a) is expressed as $V^+$ (typically−0.8 Volts in ECL applications), while a logical "0" would be $V^-$ (−1.8 Volts in ECL). Complementary line 6(b) would reverse the voltage/logic level assignment ($V^-$ for logical "1" and $V^+$ for logical "0"). Differential signaling is useful in reducing the effect of common mode noise on data transmitted. It will be understood that the aspects and embodiments of the present invention are equally applicable with other differential (and single-ended) voltage schemes and are not limited to any specific range or assignment of logic/voltage levels.

However, skew between the cables comprising a differential pair can cause potentially serious problems. The differential pair illustrated at 6(c) and 6(d) has experienced differential skew $\Delta t_{DIFF}$. When the two differential signals are processed, portions of the data will be indeterminate or entirely faulty due to the fact that the transitions are no longer matched and complementary.

Time measurement unit 10 can determine the differential skew when used with calibration board 40. This calibration procedure will not compensate for intra-cable skew, but can be used to help determine if the skew is within the allowable specification of the test setup. Unlike the single-ended calibration sequence described earlier, all combinations of measurement channels are not compared to one another.

Configuration switch bank 42 is set such that signals are routed to differential signal pairs on time measurement unit 10. As part of the calibration sequence, a DC voltage ($V_o$, which is the average between V⁺ and V⁻) is output by calibration board 40 on one of the differential signal pair, for example, on channel A⁻, while a known sequence of measurement pulses is output on the other channel A⁺.

Time measurement device 10 is configured to recognize when the voltage value of the measurement pulses is equal to the voltage $V_o$ output on the other member of the differential pair. For example, the voltage level between the two channels may be compared, and the time at which the two voltages register as being equal is stamped and stored in memory.

Once a requisite number of pulses have been output and crossing times noted, the signal outputs are reversed: the voltage $V_o$ is output on A⁺ and the same train of measurement pulses is output on channel A⁻.

Due to the intra-cable skew, the reference event (crossing of $V_o$) times will be slightly different, even though identical pulses and $V_o$ values were output to TMU 10. From these two sets of measurements, the time stamps can be statistically analyzed to determine the severity of intra-cable skew for test result reporting.

Adjusting for CSC Board Irregularities (Residual Skew)

Recall that part of the calibration output sequence stored in EEPROM 44 can contain configuration data. In one embodiment, this data includes data relating to previously determined irregularities in the synchronization of signals provided by the calibration board. These irregularities, which may be referred to as "residual skew," can be found by measuring synchronized outputs of the calibration board using an oscilloscope or a precisely calibrated time measurement device, or by calculations utilizing such factors as trace length and material as known to one skilled in the art. Examples of calibration board irregularities are illustrated in Table 5, which is representative of the data stored in EEPROM 44 on the calibration board.

TABLE 5

Calculated CSC Board Synchronization Deviation
(t = 0 is the occurrence of the synchronized event)

| channel | Event Time |
|---|---|
| A | 0 ns (reference) |
| B | 0.021 ns |
| C | 0.013 ns |
| D | −0.019 ns |

The CSC synchronization irregularity data is transmitted directly to time measurement unit 10 using the same cable connections 12 between calibration device 40 and time measurement unit 10.

In the single-ended skew example described earlier in this application, the underlying assumption that the calibration board signals were absolutely synchronized was correct. However, in real-world applications, such an assumption may be inaccurate. Consider the results that would be obtained using a calibration board with the irregularities and delays depicted in Table 5. As illustrated below in Table 6, the resulting reference event time stamps would reflect the slight delays in synchronization at calibration board 40.

TABLE 6

Reference Event Time Stamps

| Channel | Event Time Stamp | Time Stamp Corrected for irregularities |
|---|---|---|
| A | 713.994 ns | 713.994 ns |
| B | 716.283 ns | 716.262 ns |
| C | 722.018 ns | 722.005 ns |
| D | 716.435 ns | 716.454 ns |

These new reference event time stamps include the cable-to-cable skew that was determined earlier in Table 2. However, the time stamps also include slight skew due to irregularities in calibration board 40. Although great care can be taken to precisely match the signal paths (such as measurement traces 54 and 56) on the board, slight deviations are possible. Table 6 also shows the corrected time stamps after taking into account the information in Table 5. Using the same calculation methods as in the previous single-ended skew example would result in refined skew values such as $\Delta t_{AB}$=2.268 ns, $\Delta t_{AC}$=8.012 ns, $\Delta t_{AD}$=2.450 ns, etc.

The calibration board skew table values can be subtracted from the Cable Skew Calibration table values in matrix form. After subtraction of the relative skew values at the board, the skew detected at time measurement unit 10 is correct.

Alternatively, the reference event time stamps may be directly adjusted at time measurement unit 10 for the deviations in synchronization in a manner similar to that for adjusting for cable skew. This method results in the "correct" reference event time stamps and eliminates the need for a calibration board skew table and the associated calculations.

The manner in which the internal skew of calibration board 40 is transmitted to time measurement unit 10 can be either by manually keying in values such as those found in Table 5 into a file stored in time measurement unit 10. The file is later used to correct skew measurements as illustrated above. Alternatively, the information can be transferred on one of the connecting cables 12 to time measurement unit 10 using a simple time modulation or other encoding/transmission methodology. Such an embodiment employing information transfer by the calibration device itself reduces labor associated with testing and could be performed in an automated setting.

Arming Latency

Figure 7:
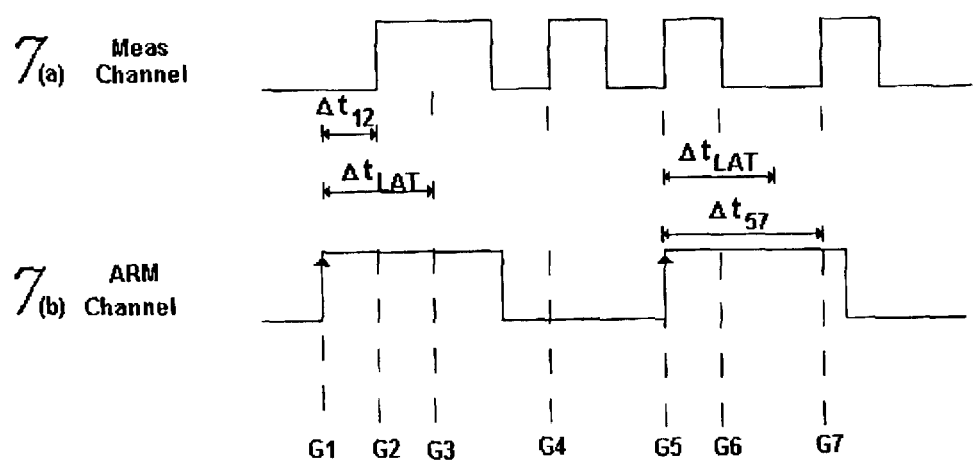
FIG. 7 displays timing diagrams 7(a) and 7(b) depicting a measurement and arming channel, respectively, along with measured edges in order to illustrate the principle of arming latency.

Calibration board 40 as illustrated in FIGS. 4(*a*) and 4(*b*) can also be used to determine the arming latency of time measurement unit 10. FIG. 7 depicts a measurement channel signal 7(*a*) featuring signal pulse edges at $G_2$, $G_4$, $G_5$, and $G_7$ with an associated arming channel 7(*b*) featuring arming pulse edges at $G_1$ and $G_5$.

In this embodiment, the system of the present invention is being used to detect and measure the rising edges at $G_2$ and $G_7$. To that end, arming signals are provided with pulse edges at $G_1$ and $G_5$ on the associated arming channel. Generally, devices such as time measurement unit 10 can detect a reference event and produce a time stamp when the arm signal is logically "1" and then only after that which is the length of the time it takes the internal circuit to arm the timing measurement circuit.

Due to arming latency $\Delta t_{LAT}$, the rising edge at $G_2$ cannot be detected. The time interval $\Delta t_{12}$ from when ARM pulse at $G_1$ is received to the intended measurement point at $G_2$ is less than the arming latency $\Delta t_{LAT}$. Thus, time measurement unit 10 does not have sufficient time to prepare its internal circuitry for measurement, and the pulse at $G_2$ is not detected. Instead, the subsequent rising edge at $G_4$ may be detected, or no measurement is made at all, resulting in an erroneous test.

The situation is different regarding the measurement channel pulse at $G_7$ in relation to the arming pulse at $G_5$. The time interval $\Delta t_{57}$ from when the ARM pulse is received at $G_5$ to the intended measurement point at $G_7$ is greater than the arming latency $\Delta t_{LAT}$, thus giving time measurement unit 10 sufficient time to arm and detect the rising edge at $G_7$.

To provide for the measurement of the arming latency of time measurement unit 10, calibration board 40 of the present invention provides a specialized arming signal and measurement channel signal output. A stable frequency oscillator within signal source generator 46 provides a constant frequency clock signal that is routed to the arming channels. Calibration board 40 also outputs a plurality of measurement channel pulses to time measurement unit 10 via the adjustable delay circuitry 48.

The adjustable delay circuitry 48 delays the pulses output to time measurement unit 10, and once the delay has been increased enough to compensate for the arming latency of time measurement unit 10, the same point or points of coincidence will be detected at time measurement unit 10.

At the point where the delay imposed on the output signal by delay circuitry 48 equals the arming latency, the time measurement unit will start detecting pulses. This point is used as an indication that the system has found its arming latency.

Figure 8:
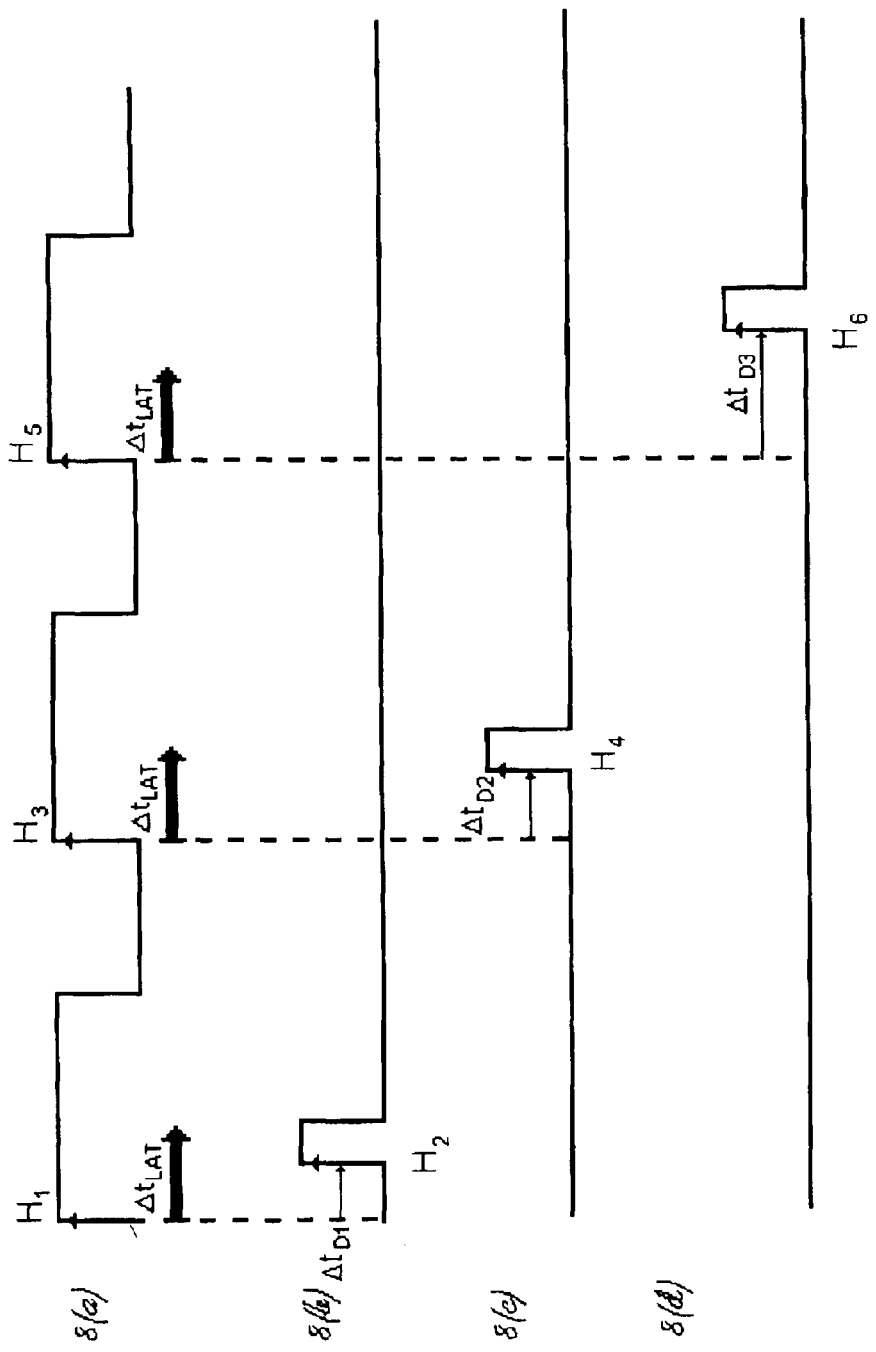
FIG. 8 displays timing diagrams 8(a)–8(d), respectively, where 8(a) is a timing diagram featuring a clocked arming channel. Timing diagrams 8(b), 8(c), and 8(d) feature measurement signal pulses, all of which depict signal events (a transition from low to high) and known delays in order to illustrate a method of determining arming latency in one embodiment of this invention.

In one embodiment, as illustrated in FIG. 8, pulses are output to the measurement channels with a delay that increases by a fixed amount with each clock pulse. The ARM pulse at time $H_1$ is received by time measurement unit 10, followed shortly by a measurement pulse rising edge at $H_2$. Initial delay $\Delta t_{D1}$ is not sufficiently long to enable arming, and the rising edge at $H_2$ is not measured or time-stamped. Subsequent rising edges at $H_4$ and $H_6$ have been delayed from their respective clocked arming pulses at $H_3$ and $H_5$ by $\Delta t_{D2}$ and $\Delta t_{D3}$, respectively. Rising edge $H_4$, delayed from arming pulse $H_3$ by $\Delta t_{D2}$, is not measured, again because edge $H_4$ is received before sufficient time has elapsed from the reception of $H_3$ by time measurement unit 10.

The delay $\Delta t_{D3}$ from arming pulse edge $H_5$ to measurement pulse edge $H_6$ is larger than $\Delta t_{LAT}$, and therefore measurement pulse $H_6$ is detected and time-stamped. Additional pulses thereafter with greater delay times relative to associated arming pulses are also detected.

After a series of incremented delays and measurements, time measurement unit 10 can prepare a table of the measurement pulse time stamps. The time stamps of the detected measurement pulses will increase at a regular interval corresponding to the clock rate and the rate of increase in the arming delay, except for points (such as those in signals 8(b) and 8(c) of FIG. 8) at which a pulse was provided before the arming latency time $\Delta t_{LAT}$ had elapsed from the nearest prior arming signal.

Since the interval and absolute time reference (from the clock provided on the ARM channel) are known, the number of "missed" pulses and their associated time stamps can be determined. The required information (the clock rate and delay increment times) can be included in the data transmitted from EEPROM 44 via cables 12 and used by the internal circuitry and/or processors of time measurement unit 10. From this information, the arming latency can be determined, as described in the example below.

Arming Latency Determination

Figure 4B:
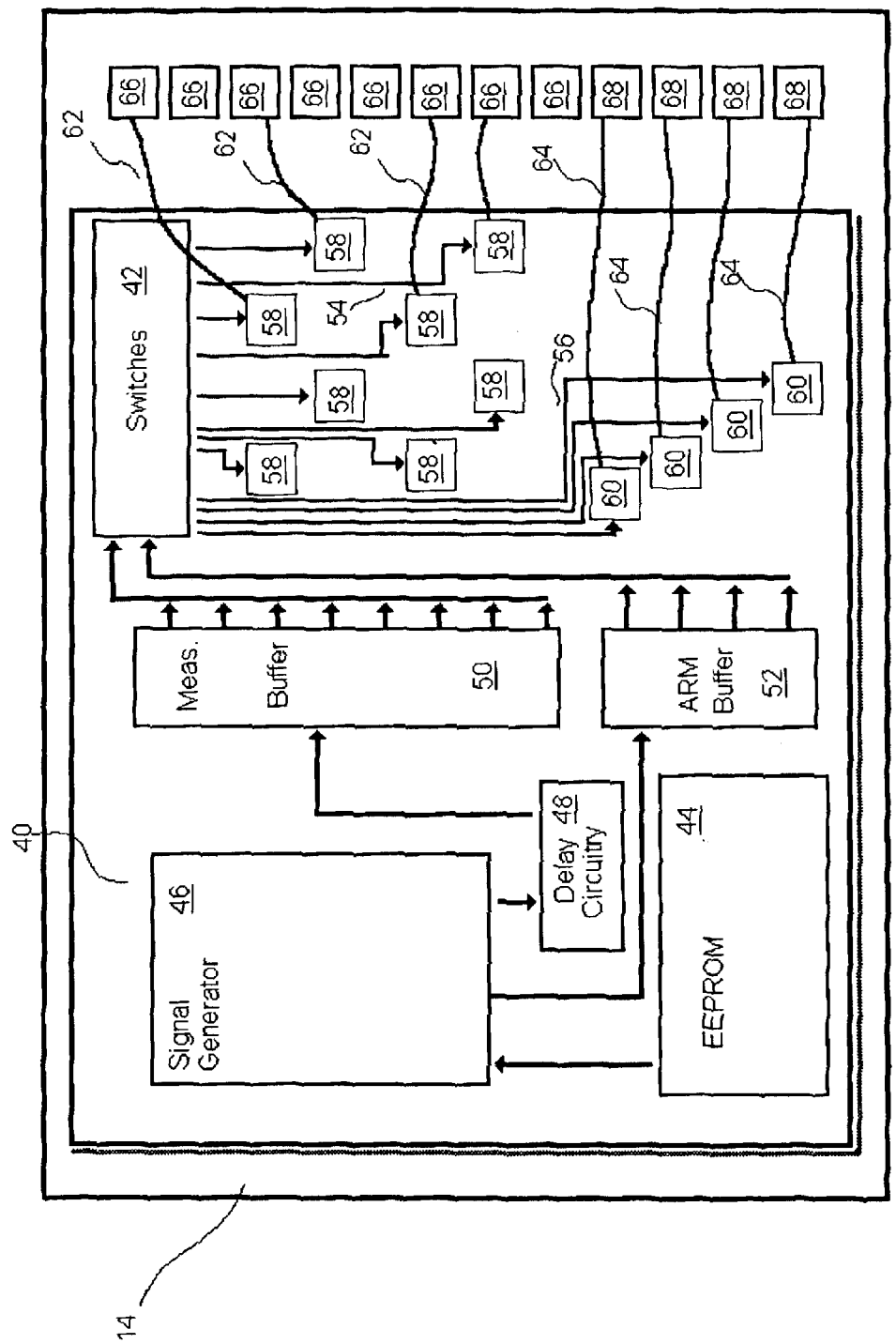

FIG. 4(b) illustrates a calibration board featuring two differential measurement channels (four total outputs) and two ARM channels. Calibration board 40 is configured, for instance, to provide an arming pulse clock output of one MHz, and switch bank 42 is set to output the differential signals on pairs A and B and pairs C and D (as represented by signals 6(a), 6(b), 6(c) and 6(d), respectively, of FIG. 6).

The skilled artisan will understand that the numbers included in the example described hereinafter are for exemplary purposes only; it is entirely within the spirit and scope of the present invention to use time values and scales different from those provided for delays, measurements, and the like.

An arming pulse provided on the arming channel at a frequency of one MHz results in a pulse every microsecond. After an initial delay of ($\Delta t_{D1}$) of 0.24 microseconds, pulses are output to the measurement channels of time measurement unit 10, with the delay from associated clocked arming pulses increasing in increments of 0.01 µs every microsecond. The first measurement channel pulse is provided after the initial delay of 0.24 microseconds from the first arming pulse at t=0. The delay is then incremented by 0.01 µs, to 0.25 µs. The next measurement channel pulse is transmitted 0.25 ns after the next arming pulse, which occurs at t=1 µs; thus the measurement channel pulse is transmitted at 1.25 µs. Time measurement unit 10 detects some of the pulses and records a time stamp. The time stamps are illustrated in Table 8.

TABLE 7

Example Time Stamps

| Measurement | Time stamp |
|---|---|
| 1 | 2.26 µs |
| 2 | 3.27 µs |
| 3 | 4.28 µs |

The 1.01 µs difference between measurements is reflective of the incrementing delay of measurement pulses from the clocked ARM pulses. However, recall that measurement pulses were also transmitted at t=0.24 µs and t=1.25 µs. Because the rate of delay incrementation and clock rate of ARM pulses are known (from data contained in the EEPROM and transmitted to the time measurement unit), these additional time stamps can be correlated with the absolute time reference provided by calibration board 40.

TABLE 8

Measurement Delays Determined by Time Measurement Unit 10

| Measurement | Delay from absolute time | Delay from nearest ARM pulse |
|---|---|---|
| Not measured | 0.24 µs | 0.24 µs |
| Not measured | 1.25 µs | 0.25 µs |
| 1 | 2.26 µs | 0.26 µs |
| 2 | 3.27 µs | 0.27 µs |
| 3 | 4.28 µs | 0.28 µs |

Recall that an ARM pulse was transmitted every 1 µs, starting at t=0 (ARM pulses were sent at t=0, 1, 2, 3, 4, . . . µs). The delay from the nearest ARM pulse can be found by subtraction. As illustrated in Table 8, time measurement unit 10 now has determined the delay of measurement pulses provided relative to the nearest ARM pulse.

The measurement pulses that were delayed 0.25 µs from the nearest ARM pulse were not detected, while those that were delayed at least 0.26 µs from the nearest ARM pulse were detected. Thus, it can be concluded that the arming latency lies between 0.25 and 0.26 µs.

Although a preferred embodiment of the invention has been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged both in whole or in part. Therefore, the spirit and scope of the appended claims should not be limited to the description of the preferred version contained herein.

What is claimed:

1. A system for calibrating a time measurement device, comprising:
   a calibration device configured to interface with automated testing equipment, said calibration circuit comprising a signal generator connected to at least one buffer-expander, each of the at least one buffer-expander providing multiple copies of a generated signal to an output bus, each output bus being connected from the automated testing equipment through cables to inputs of a measurement device;
   wherein the multiple copies of the generated signal feature identical or nearly identical timing characteristics such that signal events occur simultaneously or nearly simultaneously in each of the multiple copies at the output bus.

2. The system as defined in claim 1, wherein said at least one buffer-expander comprises a measurement signal buffer-expander and an arming signal buffer-expander, each connected to the signal generator, wherein:
   the measurement signal buffer-expander provides multiple copies of the generated signal to a measurement output bus, the measurement output bus connected to measurement channel inputs of the measurement device; and
   the arming signal buffer-expander provides multiple copies of a generated signal to an arming output bus, the arming output bus connected to at least one external arming input of the measurement device.

3. The system as defined in claim 2, further comprising programmable delay circuitry to delay the multiple copies of the generated signal provided to the measurement output bus relative to the multiple copies of the generated signal provided to the arming output bus, or vice-versa.

4. The system as defined in claim 3, wherein said delay circuitry is configured to delay the multiple copies of the generated signal provided to the measurement output bus by a predetermined time interval that progressively increases or decreases with time, and wherein said time measurement device is further configured to measure the generated signal provided to the measurement output bus, and from the measurements determine the minimum time interval between the receipt of a signal on the at least one external arming input and the measurement of an associated signal on a measurement channel.

5. The system as defined in claim 1, further comprising a memory storage device that contains information about deviations in the timing of the multiple copies of the generated signal at the output bus.

6. The system as defined in claim 5, wherein said memory storage device comprises a nonvolatile programmable memory, and wherein said memory storage device additionally stores calibration process data.

7. The system as defined in claim 6, wherein said calibration process data includes measurement and arming signal patterns and sequences for generation by said signal generator.

8. The system as defined in claim 5, wherein said memory storage device comprises a nonvolatile programmable memory, and wherein said deviation information contained therein includes data relating to residual skew between the multiple copies of the generated signal at the output bus.

9. The system as defined in claim 1, further comprising switch and inverter circuitry such that the multiple copies of the output signals provided to the output buses may be configured as single-ended signals, differential signals, or a combination thereof.

10. The system as defined in claim 9, wherein said at least one buffer-expander comprises a measurement signal buffer-expander and an arming signal buffer-expander, each connected to the signal generator, such that:
    the measurement signal buffer-expander provides multiple copies of the generated signal to a measurement output bus, the measurement output bus connected to the measurement channel inputs of the measurement device, and
    the arming signal buffer-expander provides multiple copies of a generated signal to an arming output bus, the arming output bus connected to at least one external arming input of the measurement device; and
    wherein the system further comprises programmable delay circuitry to delay the multiple copies of the generated signal provided to the measurement output bus relative to the multiple copies of the generated signal provided to the arming output bus, or vice-versa.

11. The system as defined in claim 10, further comprising a nonvolatile programmable memory for storing information relating to residual skew between the multiple copies of the generated signal provided to the output buses, and wherein said information is communicated to the measurement device through a sequence of pulses provided at the measurement output bus.

12. A calibration device for use in a calibration system, for aiding in the calibration of a time measurement device to compensate for irregularities in time measurements, the calibration device comprising:
    at least one signal generator to generate measurement and arming signal patterns;
    at least one output buffer-expander connected to said at least one signal generator, wherein said buffer-expander precisely reproduces and converts the measurement and arming signal pattern inputs into a plurality of synchronized measurement and synchronized arming signal pattern outputs for communication to a time measurement device;
    adjustable delay circuitry, interposed between said at least one signal generator and said at least one output buffer-expander, that delays the transmission of one of said signal generator pattern outputs; and
    matched signal traces connecting the outputs of said at least one output buffer-expander to a plurality of calibration device outputs.

13. The calibration device as defined in claim 12, wherein said adjustable delay circuitry is configured to delay the transmission of said measurement signal pattern.

14. The calibration device as defined in claim 12, further comprising a nonvolatile and programmable solid-state memory storage readable by said signal generator to store particular measurement and arming output signal patterns.

15. The calibration device as defined in claim 14, further comprising configuration switches interposed between the outputs of said at least one output buffer-expander and said plurality of calibration device outputs to select the routing of particular outputs of said at least one output buffer-expander to particular calibration device outputs.

16. The calibration device as defined in claim 15, wherein said configuration switches further comprise inverter circuitry such that single-ended or differential signal components may be routed to particular calibration device outputs.

17. The calibration device as defined in claim 14, wherein said at least one output buffer-expander comprises a measurement signal output buffer-expander producing a plurality of identical differential measurement signal output pairs, and an arming signal output buffer-expander producing a plurality of single-ended arming signal outputs.

18. The calibration device as defined in claim 14, wherein said at least one output buffer-expander comprises a measurement signal output buffer-expander producing a plurality of identical single-ended measurement signal outputs, and an arming signal output buffer-expander producing a plurality of single-ended arming signal outputs.

19. The calibration device as defined in claim 14, wherein said nonvolatile programmable solid-state memory storage includes calibration device configuration data and data relating to any on-board deviations in signal synchronization.

\* \* \* \* \*